US012563675B2

(12) United States Patent
Fukushima et al.

(10) Patent No.: US 12,563,675 B2
(45) Date of Patent: Feb. 24, 2026

(54) WIRING CIRCUIT BOARD ASSEMBLY SHEET

(71) Applicant: NITTO DENKO CORPORATION, Osaka (JP)

(72) Inventors: Rihito Fukushima, Osaka (JP); Takahiro Ikeda, Osaka (JP); Shun Shiga, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 209 days.

(21) Appl. No.: 18/256,170

(22) PCT Filed: Nov. 1, 2021

(86) PCT No.: PCT/JP2021/040204
§ 371 (c)(1),
(2) Date: Jun. 6, 2023

(87) PCT Pub. No.: WO2022/130807
PCT Pub. Date: Jun. 23, 2022

(65) Prior Publication Data
US 2024/0040705 A1 Feb. 1, 2024

(30) Foreign Application Priority Data

Dec. 14, 2020 (JP) ................................. 2020-207139

(51) Int. Cl.
*H05K 1/02* (2006.01)
*H05K 1/03* (2006.01)
(Continued)

(52) U.S. Cl.
CPC ........... *H05K 3/108* (2013.01); *H05K 1/0296* (2013.01); *H05K 3/0097* (2013.01); *H05K 3/18* (2013.01);
(Continued)

(58) Field of Classification Search
CPC .... H05K 3/108; H05K 1/0296; H05K 3/0097; H05K 3/18; H05K 2201/09236;
(Continued)

(56) References Cited

U.S. PATENT DOCUMENTS

2003/0172526 A1* 9/2003 Komatsubara ......... H05K 3/108
29/831
2006/0131064 A1* 6/2006 Hagiwara ........... H01L 23/4985
174/250
(Continued)

FOREIGN PATENT DOCUMENTS

JP 2001-015888 A 1/2001
JP 2001-101637 A 4/2001
(Continued)

OTHER PUBLICATIONS

International Preliminary Report on Patentability issued by WIPO on Jun. 13, 2023, in connection with International Patent Application No. PCT/JP2021/040204.
(Continued)

*Primary Examiner* — Ishwarbhai B Patel
(74) *Attorney, Agent, or Firm* — Edwards Neils LLC; Jean C. Edwards, Esq.

(57) ABSTRACT

A wiring circuit board assembly sheet includes a wiring circuit board including a conductive pattern and a frame including a dummy conductive pattern. The frame includes a dummy formation region. The dummy formation region includes the dummy conductive pattern. The dummy formation region has a width of 5 mm from an edge of the wiring circuit board and a length identical to that of the wiring circuit board in a direction in which the edge extends. The difference between the percentage of the area of the conductive pattern to the area of the insulating base layer and the percentage of the area of the dummy conductive (Continued)

pattern to the area of the dummy formation region is 50% or less.

5 Claims, 11 Drawing Sheets

(51) Int. Cl.

| | |
|---|---|
| *H05K 1/11* | (2006.01) |
| *H05K 3/00* | (2006.01) |
| *H05K 3/10* | (2006.01) |
| *H05K 3/18* | (2006.01) |
| *H05K 1/18* | (2006.01) |

(52) U.S. Cl.
CPC .............. *H05K 1/0393* (2013.01); *H05K 1/11* (2013.01); *H05K 1/111* (2013.01); *H05K 1/18* (2013.01); *H05K 2201/09236* (2013.01); *H05K 2203/0723* (2013.01)

(58) Field of Classification Search
CPC . H05K 2203/0723; H05K 2201/09781; H05K 1/056

See application file for complete search history.

(56) References Cited

U.S. PATENT DOCUMENTS

| | | | |
|---|---|---|---|
| 2010/0155113 A1 | 6/2010 | Kamei | |
| 2011/0176246 A1* | 7/2011 | Kim ........................ | H01L 24/19 |
| | | | 156/196 |
| 2012/0033395 A1 | 2/2012 | Ishii et al. | |
| 2012/0123574 A1* | 5/2012 | Moon ...................... | H05K 3/18 |
| | | | 700/97 |
| 2020/0321312 A1 | 10/2020 | Umezawa | |

FOREIGN PATENT DOCUMENTS

| | | | |
|---|---|---|---|
| JP | 2001-240976 A | 9/2001 |
| JP | 2003-273498 A | 9/2003 |
| JP | 2006-128409 A | 5/2006 |
| JP | 2006-135166 A | 5/2006 |
| JP | 2007-180212 A | 7/2007 |
| JP | 2008-277580 A | 11/2008 |
| JP | 2010-067317 A | 3/2010 |
| JP | 2010-147251 A | 7/2010 |
| JP | 2012-038914 A | 2/2012 |
| JP | 2012-060122 A | 3/2012 |
| JP | 2022-007187 A | 1/2022 |

OTHER PUBLICATIONS

International Search Report issued in PCT/JP2021/040204 on Feb. 1, 2022.
Written Opinion issued in PCT/JP2021/040204 on Feb. 1, 2022.
Notice of Reasons for Refusal issued in Japanese Patent Application No. 2020-207139 on Sep. 20, 2022.
Office Action issued by Taiwan Intellectual Property Office on Jun. 9, 2025, in connection with Taiwanese Patent Application No. 110141171.
Office Action issued by the Intellectual Property Office of Vietnam on Nov. 7, 2025, in connection with Vietnamese Patent Application No. 1-2023-03828.

* cited by examiner

WIRING CIRCUIT BOARD ASSEMBLY SHEET

CROSS-REFERENCE TO RELATED APPLICATIONS

The present application is a 35 U.S.C. 371 National Stage Entry of PCT/JP2021/040204, filed on Nov. 1, 2021, which claims priority from Japanese Patent Application No. 2020-207139, filed on Dec. 14, 2020, the contents of all of which are herein incorporated by reference in their entirety.

TECHNICAL FIELD

The present invention relates to a wiring circuit board assembly sheet.

BACKGROUND ART

It has been known to provide a dummy pattern on the support frame in a wiring circuit board assembly sheet including a plurality of wiring circuit boards and the support frame supporting the plurality of wiring circuit boards (for example, see Patent document 1 below).

CITATION LIST

Patent Document

Patent Document 1: Japanese Unexamined Patent Publication No. 2006-128409

SUMMARY OF THE INVENTION

Problem to be Solved by the Invention

When there is a large difference in wiring density between the dummy pattern and the conductive pattern of the wiring circuit board in the wiring circuit board assembly sheet as described in Patent Document 1, the thickness of the conductive pattern of the wiring circuit board may be non-uniform.

The present invention provides a wiring circuit board assembly sheet allows for the provision of a wiring circuit board on which the thickness of the conductive pattern is made uniform.

Means for Solving the Problem

The present invention [1] includes a wiring circuit board assembly sheet including: a wiring circuit board including an insulating layer and a conductive pattern located on the insulating layer; and a frame supporting the wiring circuit board and including a dummy conductive pattern made of a material identical to a material of which the conductive pattern is made, wherein the wiring circuit board includes a first edge located away from the dummy conductive pattern and a second edge located between the first edge and the dummy conductive pattern, wherein the frame includes a dummy formation region including the dummy conductive pattern, having a width of 5 mm from the second edge in a direction orthogonal to the second edge, and having a length identical to a length of the wiring circuit board in a direction in which the second edge extends, and wherein a difference between a percentage of an area of the conductive pattern to an area of the insulating layer and a percentage of an area of the dummy conductive pattern to an area of the dummy formation region is 50% or less.

In the structure described above, the difference between the percentage of the area of the conductive pattern to the area of the insulating layer and the percentage of the area of the dummy conductive pattern to the area of the dummy formation region is adjusted to 50% or less.

In other words, the density of the dummy conductive pattern in the dummy formation region approximates to the density of the conductive pattern in the wiring circuit board.

Thus, when the conductive pattern is formed, the thickness of the conductive pattern is made uniform.

As a result, a wiring circuit board on which the thickness of the conductive pattern is made uniform is produced.

The present invention [2] includes the wiring circuit board assembly sheet described in the above-described [1], wherein the difference between the percentage of the area of the conductive pattern to the area of the insulating layer and the percentage of the area of the dummy conductive pattern to the area of the dummy formation region is 30% or less.

The present invention [3] includes the wiring circuit board assembly sheet described in the above-described [1] or [2], wherein the conductive pattern includes a first conductive pattern with a first thickness and a second conductive pattern with a second thickness larger than the first thickness, and wherein the dummy conductive pattern includes a first dummy conductive pattern with the first thickness and a second dummy conductive pattern with the second thickness.

The present invention [4] includes the wiring circuit board assembly sheet described in the above-described [3], wherein a difference between a percentage of an area of the first conductive pattern to the area of the insulating layer and a percentage of an area of the first dummy conductive pattern to the area of the dummy formation region is 50% or less, and wherein a difference between a percentage of an area of the second conductive pattern to the area of the insulating layer and a percentage of an area of the second dummy conductive pattern to the area of the dummy formation region is 50% or less.

The present invention [5] includes the wiring circuit board assembly sheet described in the above-described [3], wherein a difference between a percentage of an area of the first conductive pattern to the area of the insulating layer and a percentage of an area of the first dummy conductive pattern to the area of the dummy formation region is 30% or less, and wherein a difference between a percentage of an area of the second conductive pattern to the area of the insulating layer and a percentage of an area of the second dummy conductive pattern to the area of the dummy formation region is 30% or less.

Effects of the Invention

The wiring circuit board assembly sheet of the present invention allows for the provision of a wiring circuit board on which the thickness of the conductive pattern is made uniform.

BRIEF DESCRIPTION OF THE DRAWINGS

FIG. 4A illustrates a first insulating layer forming step. FIG. 4B illustrates a step of exposing a plating resist film in a resist step. FIG. 4C illustrates a step of developing the plating resist film in the resist step.

Subsequently to FIG. 4C, FIGS. 5A to 5C are explanatory views to explain the method of producing the wiring circuit board assembly sheet.

FIG. 9A illustrates a step of exposing a plating resist film in a first resist step. FIG. 9B illustrates a step of developing the plating resist film in the first resist step. FIG. 9C illustrates a step of forming a first conductive pattern and a first dummy conductive pattern by electrolytic plating in the first pattern forming step. FIG. 9D illustrates a step of releasing a plating resist layer in the first pattern forming step.

Subsequently to FIG. 9D, FIGS. 10A to 10D are explanatory views to explain the method of producing the wiring circuit board assembly sheet of the third variation.

DESCRIPTION OF THE EMBODIMENT

1. Wiring Circuit Board Assembly Sheet

Figure 1:
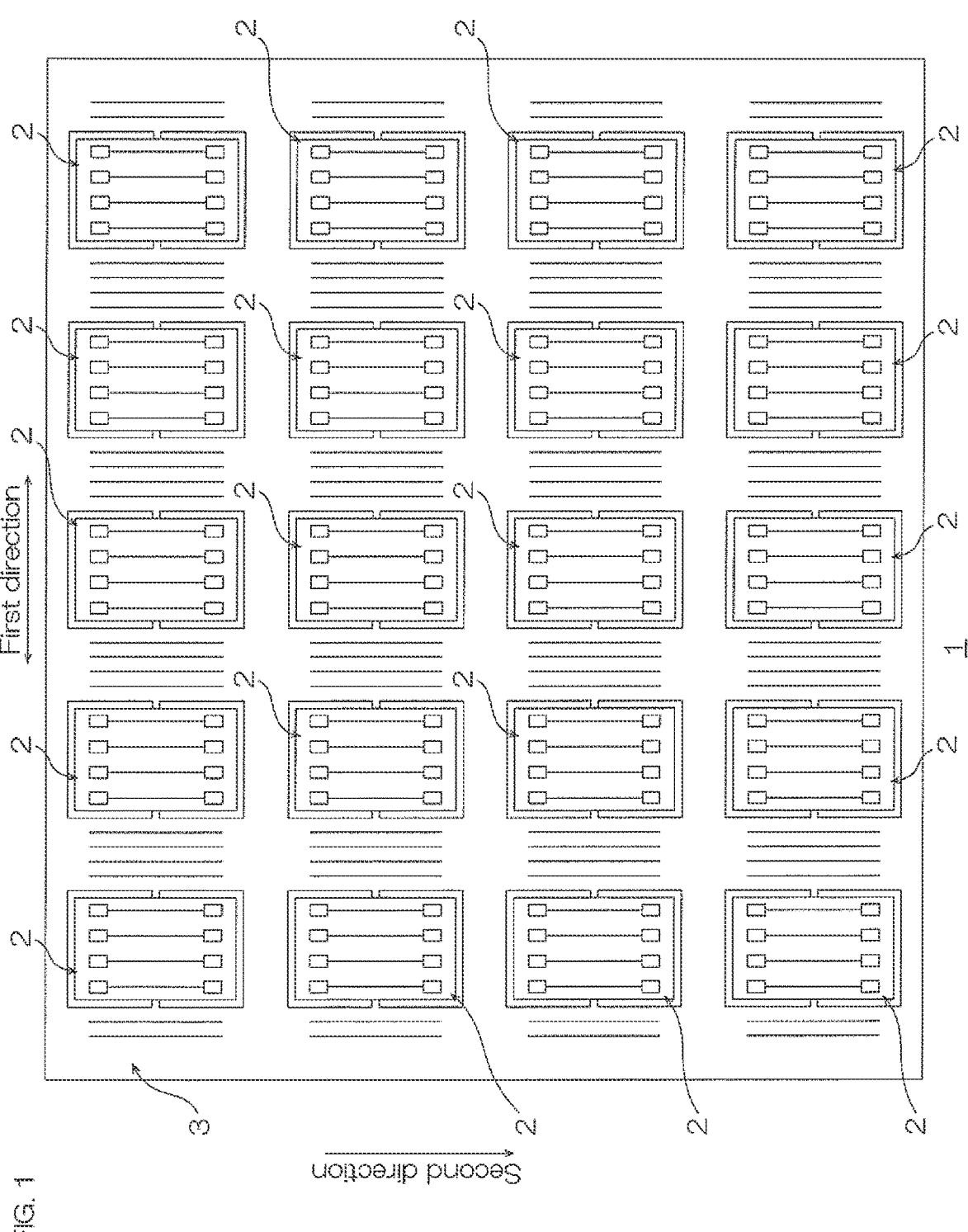
FIG. 1 is a plan view of a wiring circuit board assembly sheet as one embodiment of the present invention.

As illustrated in FIG. 1, a wiring circuit board assembly sheet 1 has a sheet shape extending in a first direction and a second direction. The second direction is orthogonal to the first direction. The wiring circuit board assembly sheet 1 includes a plurality of wiring circuit boards 2 and a frame 3.
(1) Wiring Circuit Boards The wiring circuit boards 2 are arranged at intervals in the first direction and arranged at intervals in the second direction. One of the wiring circuit boards 2 in the wiring circuit board assembly sheet 1 is described below.

Figure 2:
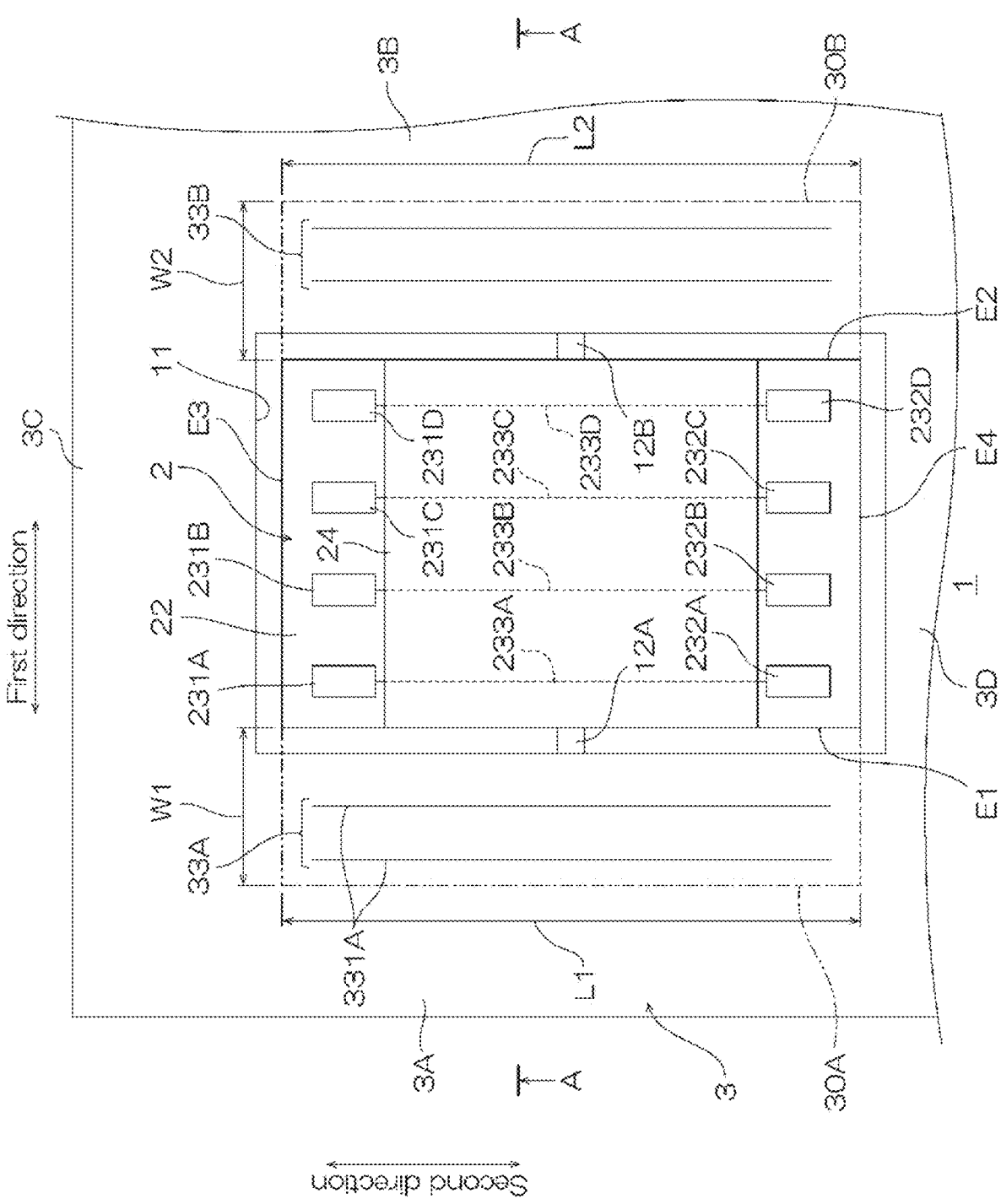
FIG. 2 is an enlarged view of a part of the wiring circuit board assembly sheet illustrated in FIG. 1.

As illustrated in FIG. 2, a wiring circuit board 2 extends in the first direction and the second direction. The wiring circuit board 2 has a plurality of edges E1, E2, E3, and E4. In the present embodiment, the wiring circuit board 2 has an approximately rectangular shape. The shape of the wiring circuit board 2 is not limited. The edge E1 is located at one end portion of the wiring circuit board 2 in the first direction. The edge E2 is located at the other end portion of the wiring circuit board 2 in the first direction. The edge E2 is located away from the edge E1 in the first direction. The edge E3 is located at one end portion of the wiring circuit board 2 in the second direction. The edge E4 is located at the other end portion of the wiring circuit board 2 in the second direction. The edge E4 is located away from the edge E3 in the second direction.

Figure 3:
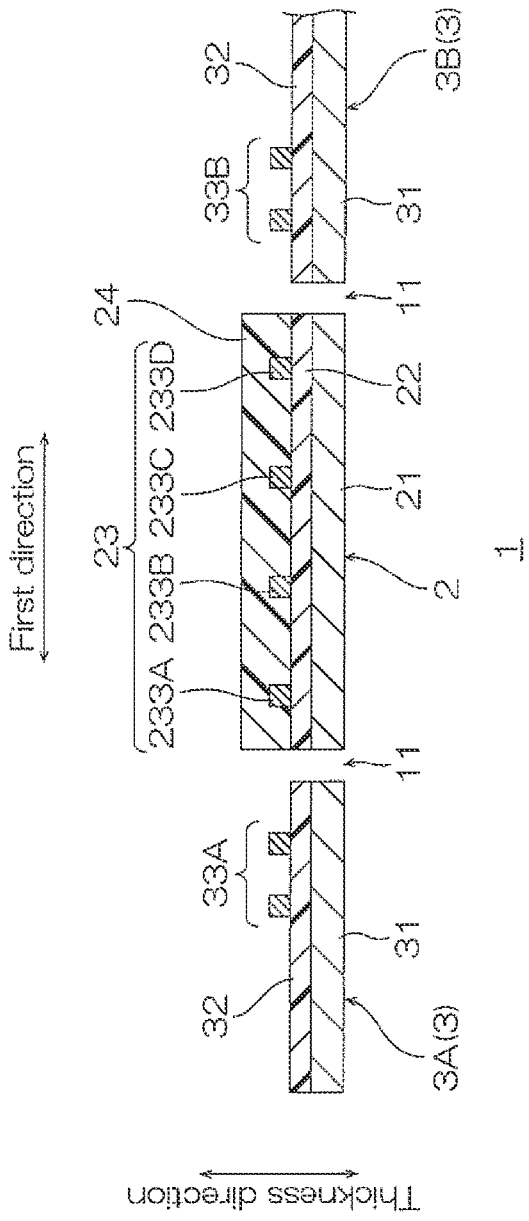
FIG. 3 is a cross-sectional view of the wiring circuit board assembly sheet illustrated in FIG. 2, taken along line A-A.

As illustrated in FIG. 3, the wiring circuit board 2 of the present embodiment includes a supporting layer 21, an insulating base layer 22 as an example of an insulating layer, a conductive pattern 23, and an insulating cover layer 24.
(1-1) Supporting Layer The supporting layer 21 supports the insulating base layer 22, the conductive pattern 23, and the insulating cover layer 24. The supporting layer 21 is made of, for example, a metal. Examples of the metal include stainless steel alloys and copper alloys.
(1-2) Insulating Base Layer The insulating base layer 22 is located on the supporting layer 21 in a thickness direction of the wiring circuit board assembly sheet 1. The thickness direction is orthogonal to the first direction and the second direction. The insulating base layer 22 is located between the supporting layer 21 and the conductive pattern 23 in the thickness direction. The insulating base layer 22 insulates the supporting layer 21 from the conductive pattern 23. The insulating base layer 22 is made of resin. Examples of the resin include polyimide.
(1-3) Conductive Pattern The conductive pattern 23 is located on the insulating base layer 22 in the thickness direction. The conductive pattern 23 is located at an opposite side to the supporting layer 21 relative to the insulating base layer 22 in the thickness direction. The conductive pattern 23 is made of a metal. Examples of the metal include copper.

As illustrated in FIG. 2, the conductive pattern 23 includes a plurality of first terminals 231A, 231B, 231C, and 231D, a plurality of second terminals 232A, 232B, 232C, and 232D, and a plurality of wires 233A, 233B, 233C, and 233D. The number of the first terminals, the number of the second terminals, and the number of the wires are not limited.

The first terminals 231A, 231B, 231C, and 231D are located at the one end portion of the wiring circuit board 2 in the second direction. In the present embodiment, the first terminals 231A, 231B, 231C, and 231D are arranged at intervals in the first direction. Each of the first terminals 231A, 231B, 231C, and 231D has a square land shape.

The second terminals 232A, 232B, 232C, and 232D are located at the other end portion of the wiring circuit board 2 in the second direction. In the present embodiment, the second terminals 232A, 232B, 232C, and 232D are arranged at intervals in the first direction. Each of the second terminals 232A, 232B, 232C, and 232D has a square land shape.

The wire 233A electrically connects the first terminal 231A and the second terminal 232A. The wire 233B electrically connects the first terminal 231B and the second terminal 232B. The wire 233C electrically connects the first terminal 231C and the second terminal 232C. The wire 233D electrically connects the first terminal 231D and the second terminal 232D.

The difference between the measured value of the thickness of the conductive pattern 23 and the designed value of the thickness of the conductive pattern 23 is, for example, 10% or less, preferably 5% or less with respect to the designed value. The lower limit of the difference between the measured value of the thickness of the conductive pattern 23 and the designed value of the thickness of the conductive pattern 23 is not limited. The difference between the measured value of the thickness of the conductive pattern 23 and the designed value of the thickness of the conductive pattern 23 may be 0%.

(1-4) Insulating Cover Layer

As illustrated in FIG. 3, the insulating cover layer 24 covers the wires 233A, 233B, 233C, and 233D. The insulating cover layer 24 is located on the insulating base layer 22 in the thickness direction. The insulating cover layer 24 does not cover the first terminals 231A, 231B, 231C, and 231D (see FIG. 2) and the second terminals 232A, 232B, 232C, and 232D (see FIG. 2). The insulating cover layer 24 is made of resin. Examples of the resin include polyimide.

(2) Frame

As illustrated in FIG. 2, the wiring circuit board assembly sheet 1 includes a notch 11 and a plurality of connecting portions 12A and 12B around the wiring circuit board 2.

The notch 11 extends along the outer shape of the wiring circuit board 2. The notch 11 defines the wiring circuit board 2 and the frame 3. The frame 3 surrounds the wiring circuit board 2. The frame 3 includes a plurality of adjacent portions 3A, 3B, 3C, and 3D around the wiring circuit board 2. The adjacent portion 3A adjoins the edge E1. The adjacent portion 3A extends along the edge E1 in the second direction. The adjacent portion 3B is located at an opposite side to the adjacent portion 3A relative to the wiring circuit board 2 in the first direction. The adjacent portion 3B adjoins the edge E2. The adjacent portion 3B extends along the edge E2 in the second direction. The adjacent portion 3C adjoins the edge E3. The adjacent portion 3C extends along the edge E3 in the first direction. The adjacent portion 3D is located at an opposite side to the adjacent portion 3C relative to the wiring circuit board 2 in the second direction. The adjacent portion 3D adjoins the edge E4. The adjacent portion 3D extends along the edge E4 in the first direction.

The connecting portions 12A and 12B connect the wiring circuit board 2 and the frame 3. In detail, the connecting portion 12A is located between the adjacent portion 3A and the edge E1 and connects the adjacent portion 3A and the edge E1. The connecting portion 12B is located between the adjacent portion 3B and the edge E2 and connects the adjacent portion 3B and the edge E2. In this manner, the frame 3 supports the wiring circuit board 2.

In the present embodiment, the frame 3 includes two dummy formation regions 30A and 30B and two dummy conductive patterns 33A and 33B for one wiring circuit board 2.

(2-1) Dummy Formation Region

The dummy formation region 30A is a region in which the dummy conductive pattern 33A is formed. The dummy formation region 30A is located at one side of the wiring circuit board 2 in the first direction. The dummy formation region 30A includes a part of the adjacent portion 3A. The dummy formation region 30A is defined based on the edge E1 of the wiring circuit board 2. The dummy formation region 30A has a width W1 of 5 mm from the edge E1 in a direction orthogonal to the edge E1 and has a length L1 identical to that of the wiring circuit board 2 in a direction in which the edge E1 extends.

The dummy formation region 30B is a region in which the dummy conductive pattern 33B is formed. The dummy formation region 30B is located at the other side of the wiring circuit board 2 in the first direction. The dummy formation region 30B includes a part of the adjacent portion 3B. The dummy formation region 30B has a width W2 of 5 mm from the edge E2 in a direction orthogonal to the edge E2 and has a length L2 identical to that of the wiring circuit board 2 in a direction in which the edge E2 extends.

(2-2) Dummy Conductive Pattern

The dummy conductive pattern 33A is located in the dummy formation region 30A. In other words, the dummy formation region 30A includes a dummy conductive pattern 33A. The dummy conductive pattern 33A is located at the one side of the wiring circuit board 2 in the first direction. The edge E2 is located away from the dummy conductive pattern 33A in the first direction. The edge E1 is located between the edge E2 and the dummy conductive pattern 33A in the first direction. The length of the dummy conductive pattern 33A in the second direction is identical to that of the conductive pattern 23 in the second direction. The dummy conductive pattern 33A may be longer than the conductive pattern 23 in the second direction. The shape of the dummy conductive pattern 33A is not limited. The shape of the dummy conductive pattern 33A may differ from that of the conductive pattern 23. In the present embodiment, the dummy conductive pattern 33A includes a plurality of dummy wires 331A.

The dummy wires 331A are arranged at intervals in the first direction. Each of the dummy wires 331A extends in the second direction. Each of the dummy wires 331A extends in a direction in which the wires 233A, 233B, 233C, and 233D of the conductive pattern 23 extend. The length of each of the dummy wires 331A in the second direction is identical to that of the conductive pattern 23 in the second direction. Each of the dummy wires 331A may be longer than the conductive pattern 23 in the second direction. The dummy conductive pattern 33A may have a comb shape in which the one end portions of the dummy wires 331A are connected to each other.

When the percentage of the area of the conductive pattern 23 to the area of the insulating base layer 22 is defined as "the area ratio of the conductive pattern" and the percentage of the area of the dummy conductive pattern 33A to the area of the dummy formation region 30A is defined as "the area ratio of the dummy conductive pattern", the difference between the area ratio of the conductive pattern and the area ratio of the dummy conductive pattern is 50% or less, preferably 30% or less, more preferably 20% or less, more preferably 10% or less, more preferably 5% or less.

The lower limit of the difference between the area ratio of the conductive pattern and the area ratio of the dummy conductive pattern is not limited. The difference between the area ratio of the conductive pattern and the area ratio of the dummy conductive pattern may be 0%.

The dummy conductive pattern 33B is located in the dummy formation region 30B. In other words, the dummy formation region 30B includes the dummy conductive pattern 33B. The dummy conductive pattern 33B is located at the other side of the wiring circuit board 2 in the first direction. The edge E1 is located away from the dummy conductive pattern 33B in the first direction. The edge E2 is located between the edge E1 and the dummy conductive pattern 33B in the first direction.

The description on the dummy conductive pattern 33B is the same as that on the dummy conductive pattern 33A. Thus, the description on the dummy conductive pattern 33B is omitted.

(2-3) Layer Structure of Frame

As illustrated in FIG. 3, the frame 3 includes a frame supporting layer 31, a frame insulating layer 32, and the dummy conductive patterns 33A and 33B.

The frame supporting layer 31 is made of a material identical to that of the supporting layer 21 of the wiring circuit board 2.

The frame insulating layer 32 is located on the frame supporting layer 31 in the thickness direction. The frame insulating layer 32 of the adjacent portion 3A is located between the frame supporting layer 31 and the dummy conductive pattern 33A in the thickness direction. The frame insulating layer 32 of the adjacent portion 3A insulates the frame supporting layer 31 from the dummy conductive pattern 33A. The frame insulating layer 32 of the adjacent portion 3B is located between the frame supporting layer 31 and the dummy conductive pattern 33B in the thickness direction. The frame insulating layer 32 of the adjacent portion 3B insulates the frame supporting layer 31 from the dummy conductive pattern 33B. The frame insulating layer 32 is made of a material identical to that of the insulating base layer 22 of the wiring circuit board 2. The frame insulating layer 32 may be formed only in a part in which the dummy conductive patterns 33A and 33B are formed.

Each of the dummy conductive patterns 33A and 33B is located on the frame insulating layer 32 in the thickness direction. Each of the dummy conductive patterns 33A and 33B is located at an opposite side to the frame supporting layer 31 relative to the frame insulating layer 32 in the thickness direction. The dummy conductive patterns 33A and 33B are made of a material identical to that of the conductive pattern 23 of the wiring circuit board 2.

The frame 3 may include an insulating cover layer covering the dummy wire patterns 33A and 33B. The insulating cover layer of the frame 3 is located on the frame insulating layer 32 in the thickness direction. The insulating cover layer of the frame 3 is made of a material identical to that of the insulating cover layer 24 of the wiring circuit board 2.

2. Method of Producing Wiring Circuit Board Assembly Sheet 1

A method of producing the wiring circuit board assembly sheet 1 is described next.

In the present embodiment, the wiring circuit board assembly sheet 1 is produced by a semi-additive method. The wiring circuit board assembly sheet 1 may be produced by an additive method. The method of producing the wiring circuit board assembly sheet 1 includes a first insulating layer forming step (see FIG. 4A), a resist step (see FIGS. 4B and 4C), a pattern forming step (see FIGS. 5A and 5B), and a second insulating layer forming step (see FIG. 5C).

(1) First Insulating Layer Forming Step

Figures 4A, 4B, 4C:
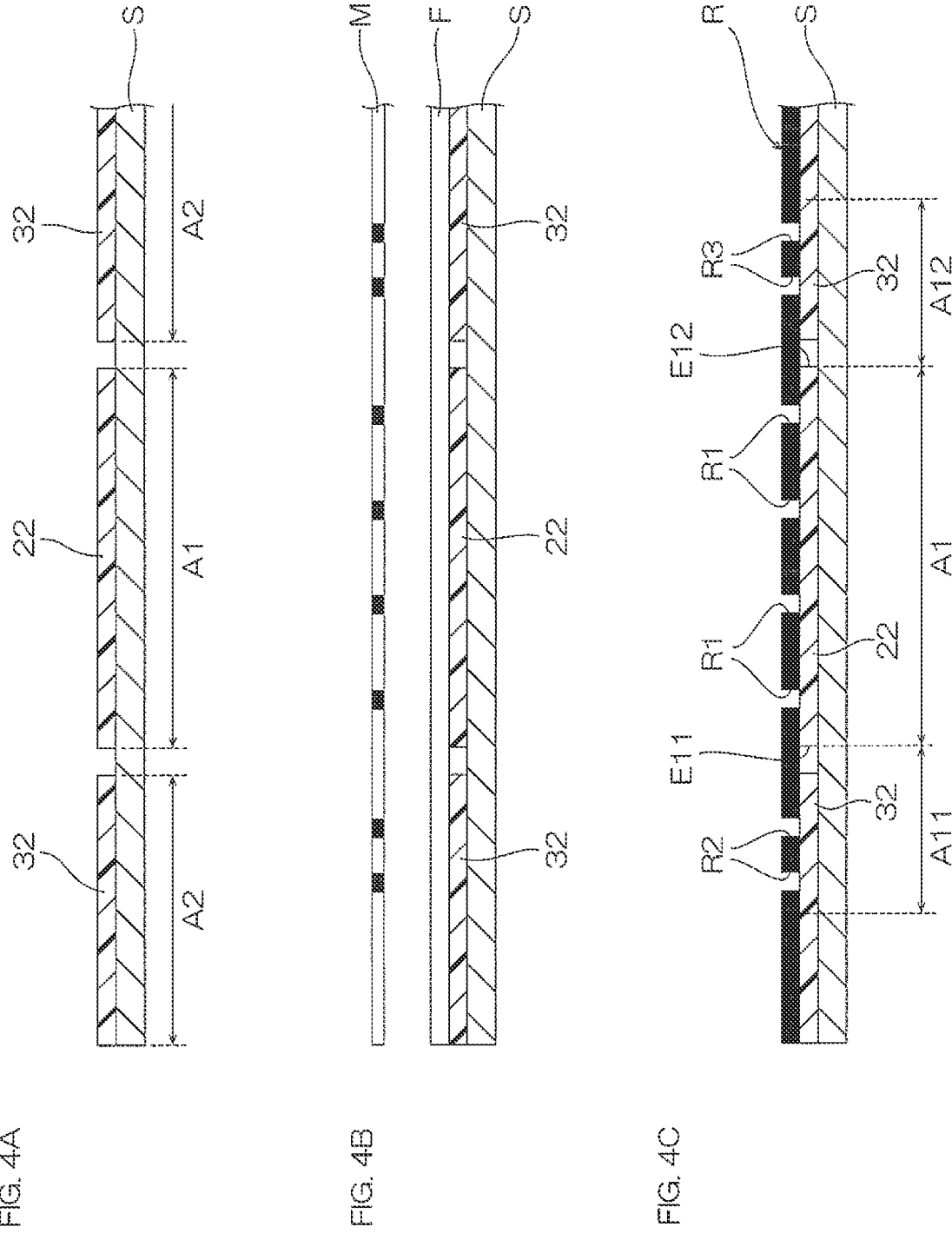
FIGS. 4A to 4C are explanatory views to explain a method of producing the wiring circuit board assembly sheet.

As illustrated in FIG. 4A, in the first insulating layer forming step, the insulating base layer 22 and the frame insulating layer 32 are formed on a substrate S.

The substrate S is the material of the supporting layer 21 of the wiring circuit board 2 (see FIG. 3) and the frame supporting layer 31 of the frame 3 (see FIG. 3). The substrate S is metal foil made of a metal that forms the supporting layer 21 and the frame supporting layer 31.

In the first insulating layer forming step, the insulating base layer 22 is formed on a product region A1 of the substrate S, and the frame insulating layer 32 is formed on the frame region A2 of the substrate S. The product region A1 is a region to become the wiring circuit board 2. The frame region A2 is a region to become the frame 3.

In the first insulating layer forming step, first, a solution (varnish) of photosensitive resin is applied and dried on the substrate S to form a photosensitive resin film. Next, the photosensitive resin film is exposed and developed. In this manner, the insulating base layer 22 and the frame insulating layer 32 are formed on the substrate S.

(2) Resist Step

Next, in the resist step, a plating resist layer R is formed on the insulating base layer 22 and the frame insulating layer 32.

In the resist step, first, a seed layer is formed on the surfaces of the insulating base layer 22 and the frame insulating layer 32. The seed layer is formed, for example, by sputtering. Examples of the material of the seed layer include chromium, copper, nickel, titanium, and alloys thereof.

Next, as illustrated in FIG. 4B, a plating resist film F is bonded onto the insulating base layer 22 and the frame insulating layer 32 after the seed layer is formed thereon. Next, the photomask M is layered on the plating resist film F. Then, the plating resist film F is exposed while the parts in which the conductive pattern 23 and the dummy conductive patterns 33A and 33B are to be formed is shielded from the light.

Next, as illustrated in FIG. 4C, the exposed plating resist film F is developed. In this manner, the plating resist is removed from the shielded parts, i.e., the parts in which the conductive pattern 23 and the dummy conductive patterns 33A and 33B are to be formed. The plating resist remains in the exposed parts, i.e., the parts in which the conductive pattern 23 and the dummy conductive patterns 33A and 33B are not to be formed. In this manner, a plating resist layer R having openings R1, R2, and R3 is formed on the insulating base layer 22 and the frame insulating layer 32. The openings R1 are formed by removing the plating resist from the part in which the conductive pattern 23 is to be formed. The openings R2 are formed by removing the plating resist from the part in which the dummy conductive pattern 33A is to be formed. The openings R3 are formed by removing the plating resist from the part in which the dummy conductive pattern 33B is to be formed. The seed layer is exposed through the openings R1, R2, and R3.

When the percentage of the area of the openings R1 to the area of the insulating base layer 22 is defined as "the conductive pattern opening ratio" and the percentage of the area of the openings R2 to the area of the dummy formation region A11 and the percentage of the area of the openings R3 to the area of the dummy formation region A12 are defined as "the dummy conductive pattern opening ratio", the difference between the conductive pattern opening ratio and the dummy conductive pattern opening ratio is 50% or less, preferably 30% or less, more preferably 20% or less, more preferably 10% or less, more preferably 5% or less.

The dummy formation region A11 in the method of producing the wiring circuit board assembly sheet 1 is defined based on a product region A1.

Specifically, the dummy formation region A11 has a width of 5 mm from the edge E11 in a direction orthogonal to the edge E11 at one side of the product region A1 in the first direction and a length identical to that of the product region A1 in a direction in which the edge E11 extends. Thus, the range of the dummy formation region A11 is the same as the above-described range of the dummy formation region 30A (see FIG. 2).

The dummy formation region A12 has a width of 5 mm from the edge E12 in a direction orthogonal to the edge E12 at the other side of the product region A1 in the first direction and a length identical to that of the product region A1 in a direction in which the edge E12 extends. The range of the dummy formation region A12 is the same as the above-described range of the dummy formation region 30B (see FIG. 2).

(3) Pattern Forming Step

Figures 5A, 5B, 5C:
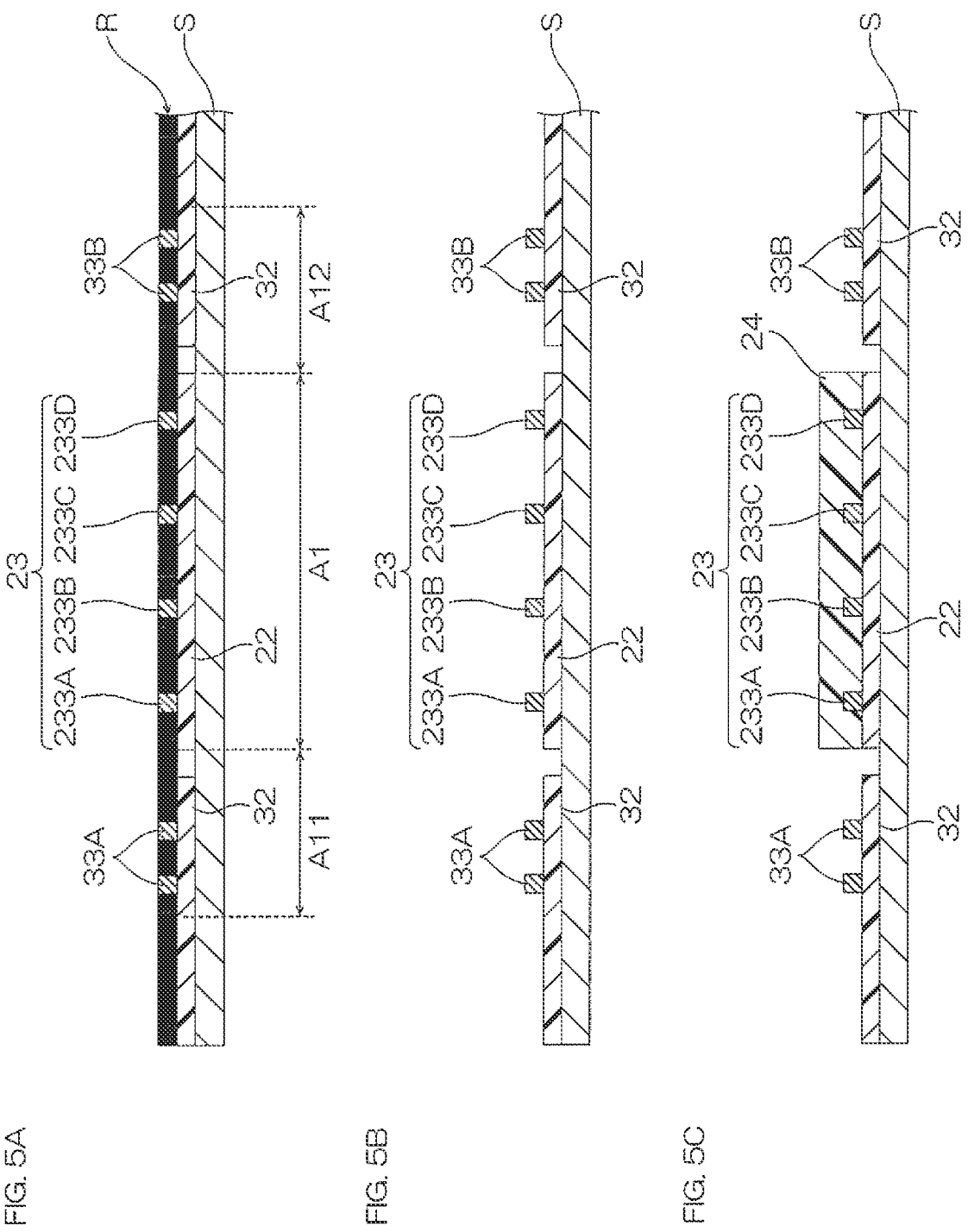
FIG. 5A illustrates a step of forming a conductive pattern and a dummy conductive pattern by electrolytic plating in a pattern forming step.
FIG. 5B illustrates a step of releasing a plating resist layer in the pattern forming step.
FIG. 5C illustrates a second insulating layer forming step.

Next, in the pattern forming step, as illustrated in FIG. 5A, electrolytic plating is carried out to form the conductive pattern 23 on the seed layer in the openings R1 (see FIG. 4C), the dummy conductive pattern 33A on the seed layer in the openings R2 (see FIG. 4C), and the dummy conductive pattern 33B on the seed layer in the openings R3 (see FIG. 4C).

At the time, the conductive pattern 23 is formed together with the dummy conductive patterns 33A and 33B. Hence, the metallic ion concentration around the product region A1 can be homogenized in the plating solution, and thus the thickness of the conductive pattern 23 can be made uniform.

After the completion of the electrolytic plating, as illustrated in FIG. 5B, the plating resist layer R is released. Thereafter, the seed layer covered with the plating resist layer R is removed by etching.

(4) Second Insulating Layer Forming Step

Next, in the second insulating layer forming step, as illustrated in FIG. 5C, the insulating cover layer 24 is formed on the insulating base layer 22 and the conductive pattern 23.

In the second insulating layer forming step, first, a solution (varnish) of photosensitive resin is applied and dried on the insulating base layer 22 and the conductive pattern 23 to form a photosensitive resin film. Next, the photosensitive resin film is exposed and developed. In this manner, the insulating cover layer 24 is formed.

Thereafter, as illustrated in FIG. 3, the substrate S between the product region A1 (see FIG. 4A) and the frame region A2 (see FIG. 4A) is removed by etching, thereby producing the above-described wiring circuit board assembly sheet 1.

3. Operations and Effects

In the wiring circuit board assembly sheet 1, as illustrated in FIG. 2, the difference between the area ratio of the conductive pattern and the area ratio of the dummy conductive patterns is adjusted to 50% or less.

In other words, the density of the dummy conductive pattern 33A in the dummy formation region 30A approximates to the density of the conductive pattern 23 in the wiring circuit board 2.

Thus, the thickness of the conductive pattern 23 is made uniform.

In detail, when the wiring circuit board assembly sheet 1 is produced, the difference between the conductive pattern opening ratio and the dummy conductive pattern opening ratio of the plating resist layer R is adjusted to 50% or less in the resist step as illustrated in FIG. 4C. In this manner, as illustrated in FIG. 5A, when electrolytic plating is carried out in the pattern forming step, the metallic ion concentration around the product region A1 is homogenized in the plating solution, and the thickness of the conductive pattern 23 is made uniform.

Thus, as illustrated in FIG. 3, in the wiring circuit board assembly sheet 1 in which the difference between the area ratio of the conductive pattern and the area ratio of the dummy conductive patterns is 50% or less, the thickness of the conductive pattern 23 is made uniform.

As a result, a wiring circuit board 2 in which the thickness of the conductive pattern 23 is made uniform is produced.

4. Variations

Next, variations of the wiring circuit board assembly sheet 1 are described with reference to FIGS. 6 to 10D. In each of the variations, the same members as in the above-described embodiment are given the same reference numerals, and the detailed descriptions thereof are omitted.

Figure 6:
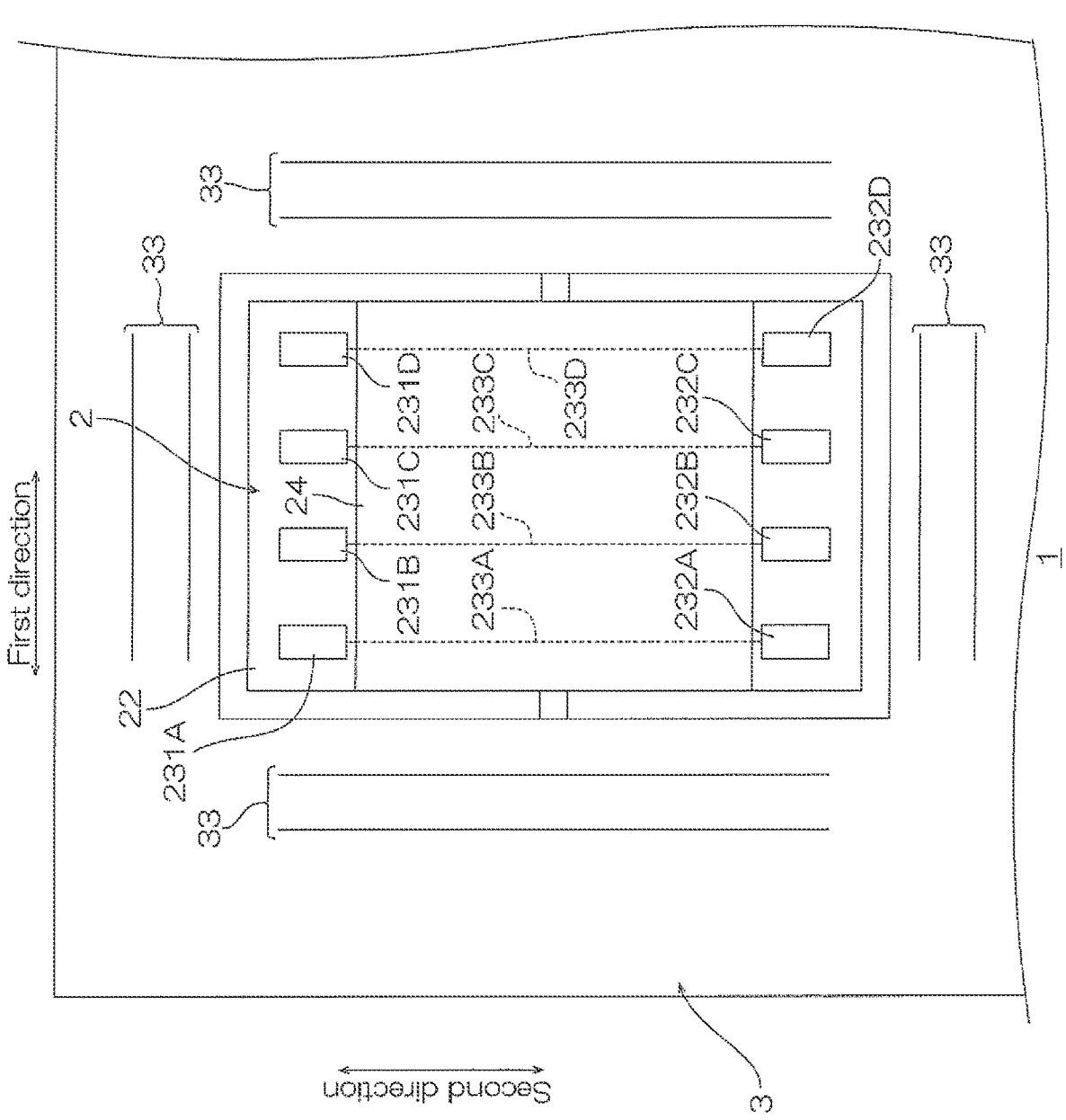
FIG. 6 is an explanatory view to explain a first variation.

(1) As illustrated in FIG. 6, the dummy conductive patterns 33 may be disposed at both sides of the wiring circuit board 2 in the first direction and at both sides of the wiring circuit board 2 in the second direction. The dummy conductive patterns 33 may extend in a direction intersecting with a direction in which the wires 233A, 233B, 233C, and 233D of the conductive pattern 23 extend.

Figure 7:
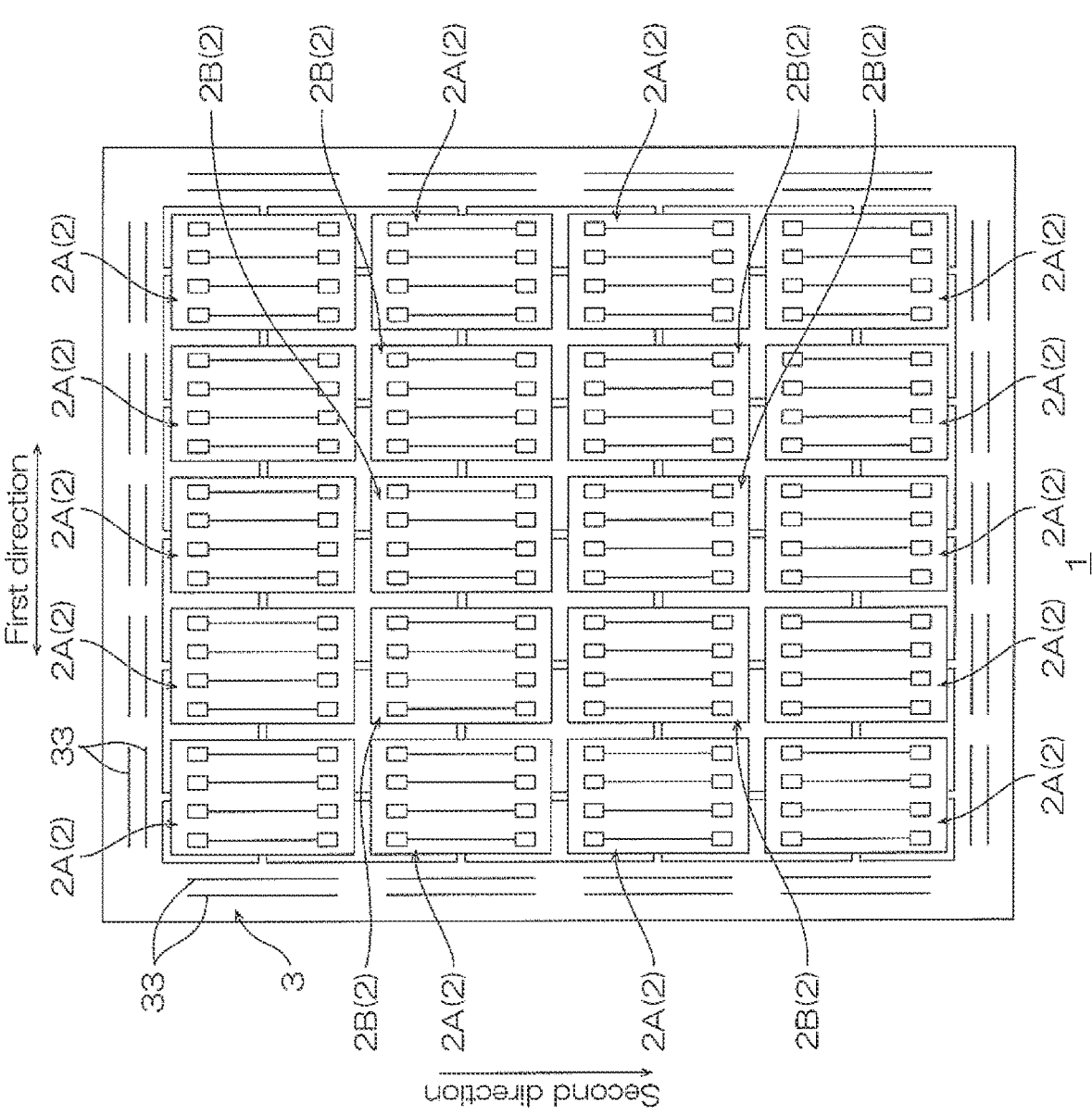
FIG. 7 is an explanatory view to explain a second variation.

(2) As illustrated in FIG. 7, when wiring circuit boards 2 are disposed closely to each other, the dummy conductive patterns 33 do not have to be between the wiring circuit boards 2. In detail, the wiring circuit boards 2 are connected to each other through the connecting portions. The frame 3 is located in an outer peripheral part of the wiring circuit board assembly sheet 1. The frame 3 surrounds the wiring circuit boards 2. In this case, the dummy formation region is defined based on the edges of the wiring circuit boards 2A closest to the frame 3.

In this variation, of wiring circuit boards 2B in the central part (i.e., the part that is not adjacent to the frame 3 in the outer peripheral part) of the wiring circuit board assembly sheet 1, the wiring density is homogenized based on the adjacent wiring circuit boards 2A and 2B.

Thus, when the dummy formation region is defined based on the edges of the wiring circuit boards 2A closest to the frame 3 and the wiring density of the dummy conductive patterns 33 in the dummy formation region is set to an approximation to the wiring density of the conductive patterns 23 of the wiring circuit boards 2A, the wiring density is homogenized in all the wiring circuit boards 2 of the wiring circuit board assembly sheet 1.

Thus, also in this variation, the same operations and effects as those of the above-described embodiment are achieved.

Figure 8:
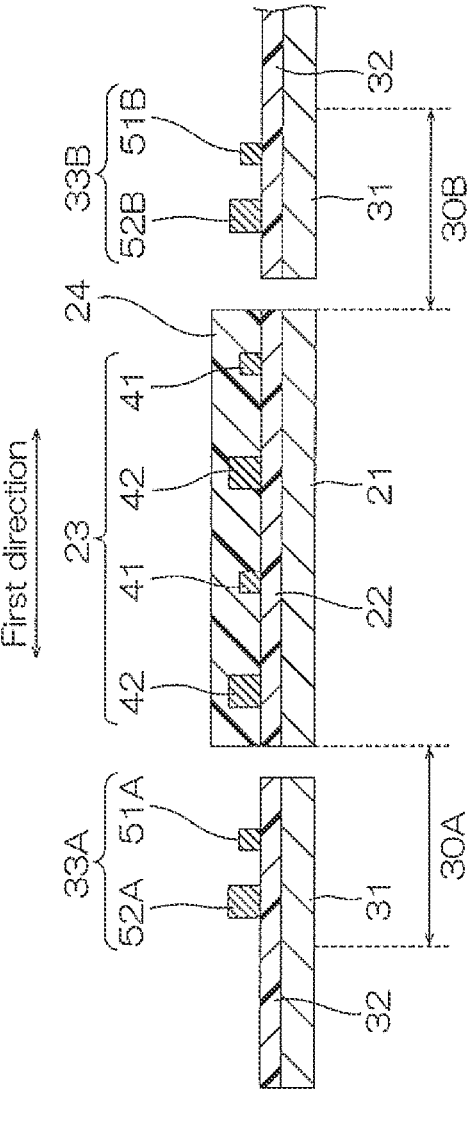
FIG. 8 is a cross-sectional view of the wiring circuit board assembly sheet of a third variation.

(3) As illustrated in FIG. 8, the conductive pattern 23 may include a first conductive pattern 41 with a first thickness T1 and a second conductive pattern 42 with a second thickness T2 larger than the first thickness T1.

In this case, the dummy conductive pattern 33A includes a first dummy conductive pattern 51A with the first thickness T1 and a second dummy conductive pattern 52A with the second thickness T2.

The shapes of the first dummy conductive pattern 51A and the second dummy conductive pattern 52A are not limited. When the first dummy conductive pattern 51A includes a plurality of dummy wires and the second dummy conductive pattern 52A includes a plurality of dummy wires, the dummy wires of the first dummy conductive pattern 51A and the dummy wires of the second dummy conductive pattern 52A may alternately be arranged.

The difference between the percentage of the area of the first conductive patterns 41 to the area of the insulating base layer 22 and the percentage of the area of the first dummy conductive pattern 51A to the area of the dummy formation region 30A (see FIG. 2) is 50% or less, preferably 30% or less, more preferably 20% or less, more preferably 10% or less, more preferably 5% or less.

The difference between the percentage of the area of the second conductive pattern 42 to the area of the insulating base layer 22 and the percentage of the area of the second dummy conductive pattern 52A to the area of the dummy formation region 30A (see FIG. 2) is 50% or less, preferably 30% or less, more preferably 20% or less, more preferably 10% or less, more preferably 5% or less.

The dummy conductive pattern 33B also includes a first dummy conductive pattern 51B with the first thickness T1 and a second dummy conductive pattern 52B with the second thickness T2. The description on the dummy conductive pattern 33B is the same as that on the dummy conductive pattern 33A. Thus, the description on the dummy conductive pattern 33B is omitted.

The production method of this variation includes the above-described first insulating layer forming step (see FIG. 4A), a first resist step (see FIGS. 9A and 9B), a first pattern forming step (see FIGS. 9C and 9D), a second resist step (see FIGS. 10A and 10B), a second pattern forming step (see FIGS. 10C and 10D), and the above-described second insulating layer forming step (see FIG. 5C).

Figures 9A, 9B, 9C, 9D:
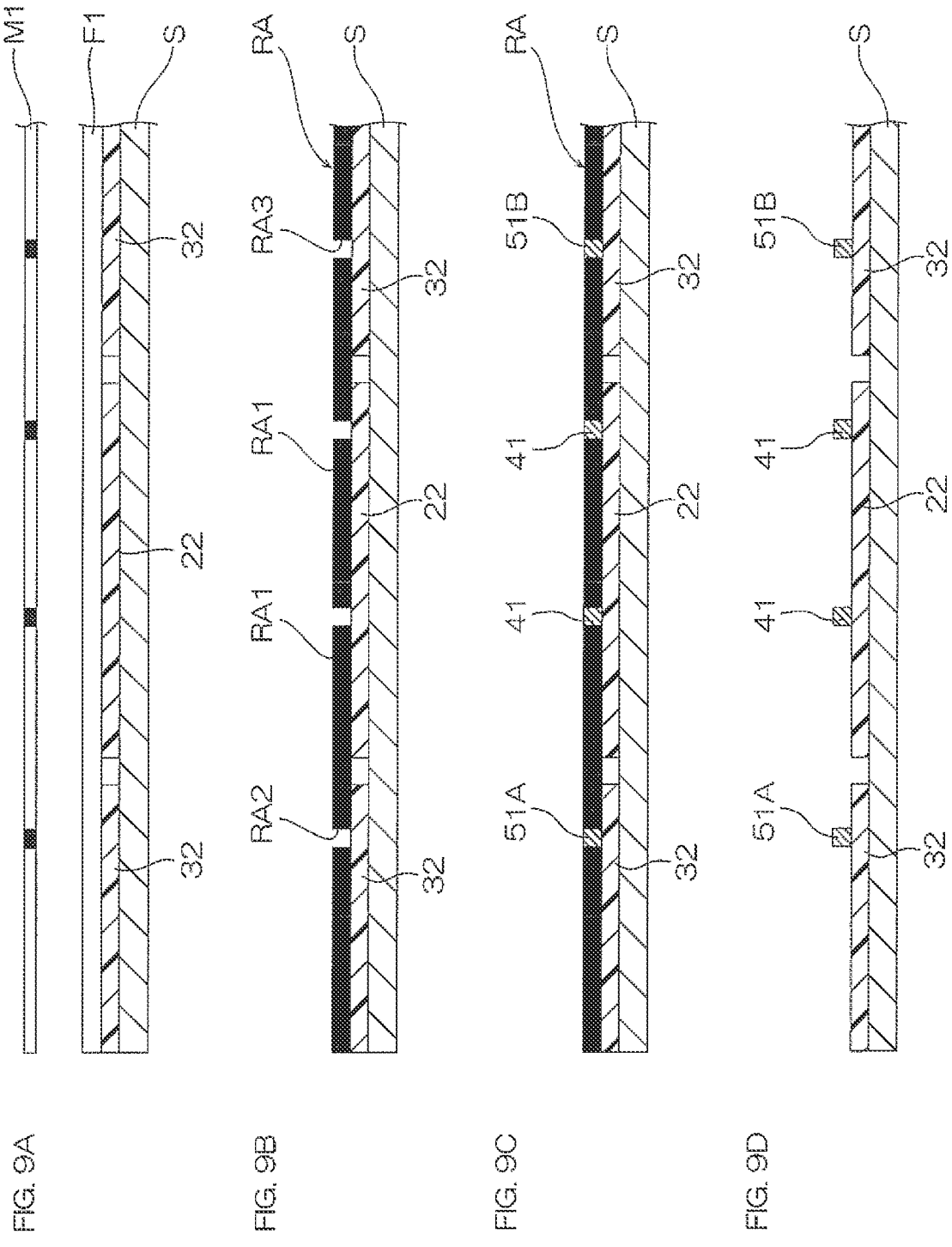
FIGS. 9A to 9D are explanatory views to explain a method of producing the wiring circuit board assembly sheet of the third variation.

In the first resist step, as illustrated in FIGS. 9A and 9B, a plating resist layer RA having openings RA1, RA2, and RA3 is formed on the insulating base layer 22 and the frame insulating layer 32 in the same manner as the above-described resist step. The openings RA1 are formed by removing the plating resist from the parts in which the first conductive patterns 41 are to be formed. The opening RA2 is formed by removing the plating resist from the part in which the first dummy conductive pattern 51A is to be formed. The opening RA3 is formed by removing the plating resist from the part in which the first dummy conductive pattern 51B is to be formed.

The difference between the percentage of the area of the openings RA1 to the area of the insulating base layer 22 and the percentage of the area of the opening RA2 to the area of the dummy formation region A11 is 50% or less, preferably 30% or less, more preferably 20% or less, more preferably 10% or less, more preferably 5% or less.

The difference between the percentage of the area of the openings RA1 to the area of the insulating base layer 22 and the percentage of the area of the opening RA3 to the area of the dummy formation region A12 is 50% or less, preferably 30% or less, more preferably 20% or less, more preferably 10% or less, more preferably 5% or less.

Next, in the first pattern forming step, as illustrated in FIG. 9C, electrolytic plating is carried out to form the first conductive patterns 41 on the seed layer in the openings RA1, the first dummy conductive pattern 51A on the seed layer in the opening RA2, and the first dummy conductive pattern 51B on the seed layer in the opening RA3.

At the time, the first conductive patterns 41 are formed together with the first dummy conductive patterns 51A and 51B. The first dummy conductive pattern 51A is formed in the dummy formation region A11 of the above-described range. The first dummy conductive pattern 51B is formed in the dummy formation region A12 of the above-described range.

Hence, the metallic ion concentration around the product region A1 can be homogenized in the plating solution, and thus the thickness of the first conductive pattern 41 can be made uniform.

After the completion of the electrolytic plating, as illustrated in FIG. 9D, the plating resist layer RA is released. Thereafter, the seed layer covered with the plating resist layer RA is removed by etching.

Figures 10A, 10B, 10C, 10D:
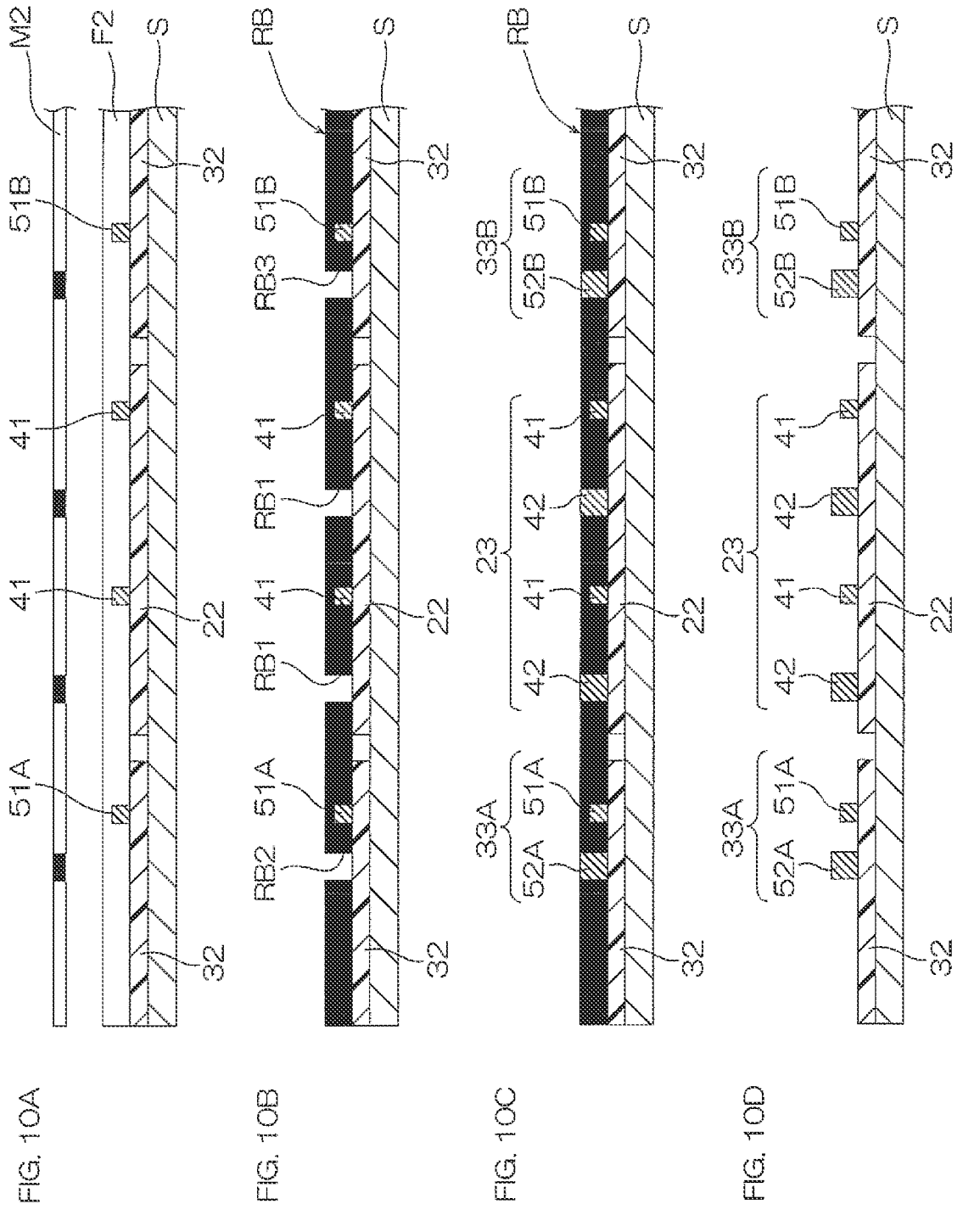
FIG. 10A illustrates a step of exposing a plating resist film in a second resist step.
FIG. 10B illustrates a step of developing the plating resist film in the second resist step.
FIG. 10C illustrates a step of forming a second conductive pattern and a second dummy conductive pattern by electrolytic plating in the second pattern forming step.
FIG. 10D illustrates a step of releasing a plating resist layer in the second pattern forming step.

In the second resist step, as illustrated in FIGS. 10A and 10B, a plating resist layer RB having openings RB1, RB2, and RB3 is formed on the insulating base layer 22 and the frame insulating layer 32 in the same manner as the above-described resist step. The openings RB1 are formed by removing the plating resist from the parts in which the second conductive patterns 42 are to be formed. The opening RB2 is formed by removing the plating resist from the part in which the second dummy conductive pattern 52A is to be formed. The opening RB3 is formed by removing the plating resist from the part in which the second dummy conductive pattern 52B is to be formed.

The difference between the percentage of the area of the openings RB1 to the area of the insulating base layer 22 and the percentage of the area of the opening RB2 to the area of the dummy formation region A11 is 50% or less, preferably 30% or less, more preferably 20% or less, more preferably 10% or less, more preferably 5% or less.

The difference between the percentage of the area of the openings RB1 to the area of the insulating base layer 22 and the percentage of the area of the opening RB3 to the area of the dummy formation region A12 is 50% or less, preferably 30% or less, more preferably 20% or less, more preferably 10% or less, more preferably 5% or less.

Next, in the second pattern forming step, as illustrated in FIG. 10C, electrolytic plating is carried out to form the second conductive patterns 42 on the seed layer in the openings RB1, the second dummy conductive pattern 52A on the seed layer in the opening RB2, and the second dummy conductive pattern 52B on the seed layer in the opening RB3. At the time, the second conductive patterns 42 are formed together with the second dummy conductive patterns 52A and 52B. The second dummy conductive pattern 52A is formed in the dummy formation region A11 of the above-described range. The second dummy conductive pattern 52B is formed in the dummy formation region A12 of the above-described range.

Hence, the metallic ion concentration around the product region A1 is homogenized in the plating solution, and thus the thickness of the second conductive pattern 42 can be made uniform.

After the completion of the electrolytic plating, as illustrated in FIG. 10D, the plating resist layer RB is released. Thereafter, the seed layer covered with the plating resist layer RB is removed by etching.

Figure 11:
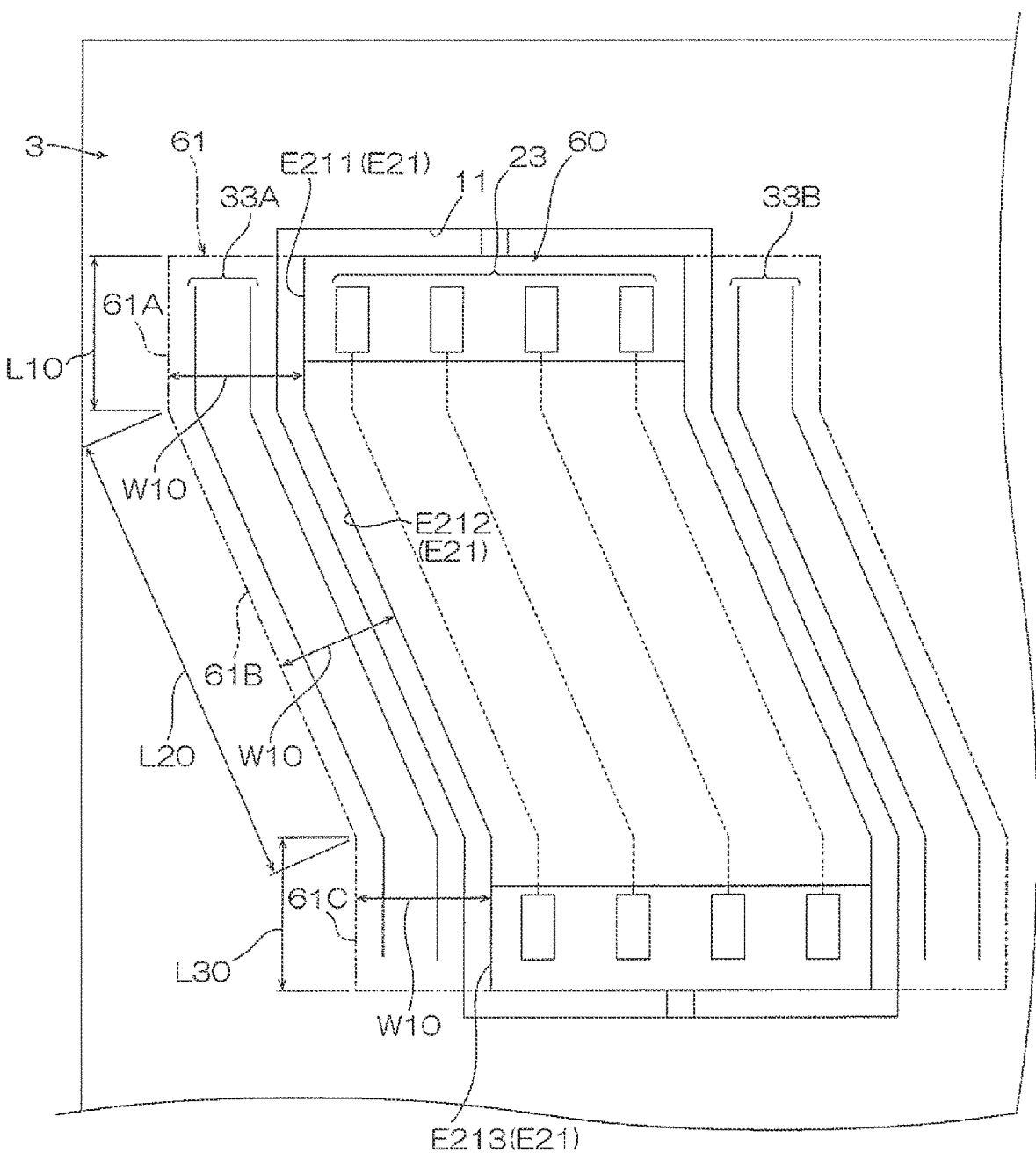
FIG. 11 is an explanatory view to explain a fourth variation.

(4) As illustrated in FIG. 11, when an edge E21 at one side of a wiring circuit board 60 in the first direction includes an edge E211 extending in the second direction, an edge E212 inclined relative to the second direction, and an edge E213 extending in the second direction, the dummy formation region 61 includes, along the edge E21, a part 61A extending in the second direction, a part 61B inclined relative to the second direction, and a part 61C extending in the second direction.

The part 61A has a width W10 of 5 mm from the edge E211 in a direction orthogonal to a direction in which the edge E211 extends and a length L10 identical to that of the part extending in the second direction of the wiring circuit board 60 in a direction in which the edge E211 extends.

The part 61B has a width W10 of 5 mm from the edge E212 in a direction orthogonal to a direction in which the edge E212 extends and a length L20 identical to that of the part extending in a direction inclined relative to the second direction of the wiring circuit board 60 in a direction in which the edge E212 extends.

The part 61C has a width W10 of 5 mm from the edge E213 in a direction orthogonal to a direction in which the edge E213 extends and a length L30 identical to that of the part extending in a direction inclined relative to the second direction of the wiring circuit board 60 in a direction in which the edge E213 extends.

To sum up, the dummy formation region 61 has a width W10 of 5 mm from each of the edges E211, E212, and E213 in a direction orthogonal to a direction in which each of the edges E211, E212, and E213 extends and a length (L10+

L20+L30) identical to that of the wiring circuit board 60 in a direction in which the edges E211, E212, and E213 extend.

Also in this variation, the same operations and effects as those of the above-described embodiment are achieved.

EXAMPLES

Next, the present invention is described with reference to Examples and Comparative Examples. The present invention is not limited to Examples. The specific numeral values used in the description below, such as physical property values and parameters, can be replaced with the corresponding physical property values and parameters in the above-described "DESCRIPTION OF THE EMBODIMENTS", including the upper limit values (numeral values defined with "or less") or the lower limit values (numeral values defined with "or more").

1. Production of Wiring Circuit Board Assembly Sheet

By a semi-additive method, the wiring circuit board assembly sheet of each of Examples and Comparative Examples was produced.

In detail, first, a solution (varnish) of photosensitive resin was applied and dried on metal foil (a substrate), thereby forming a photosensitive resin film.

Next, the photosensitive resin film was exposed and developed, thereby forming an insulating base layer and a frame insulating layer on the metal foil (the first insulating layer forming step, see FIG. 4A).

Next, a seed layer was formed on the surfaces of the insulating base layer and the frame insulating layer by sputtering.

Next, a plating resist film was bonded on the insulating base layer and frame insulating layer on which the seed layer was formed.

Next, a photomask was layered on the plating resist film, and the plating resist film was exposed while the parts in which the conductive pattern and the dummy conductive pattern were to be formed were shielded from the light (see FIG. 4B).

Next, the exposed plating resist film was developed, thereby forming a plating resist layer (the resist step, see FIG. 4C). First openings were formed on the plating resist layer by removing the plating resist from the part in which the conductive pattern was to be formed. Second openings were formed by removing the plating resist from the part in which the dummy conductive pattern was to be formed.

Next, electrolytic plating was carried out, thereby forming a conductive pattern on the seed layer in the first openings and a dummy conductive pattern on the seed layer in the second openings (the pattern forming step, see FIG. 5A).

After the completion of the electrolytic plating, the plating resist layer was released (see FIG. 5B). Thereafter, the seed layer covered with the plating resist layer was removed by etching.

Next, a solution (varnish) of photosensitive resin was applied and dried on the insulating base layer and the conductive pattern, thereby forming a photosensitive resin film. Next, the photosensitive resin film was exposed and developed, thereby forming an insulating cover layer (see FIG. 5C, the second insulating layer forming step).

Thereafter, the substrate was etched along the outer shape of the wiring circuit board, thereby producing a wiring circuit board assembly sheet.

Of the produced wiring circuit board assembly sheets, the percentage of the area of the conductive pattern (the area ratio of the conductive pattern) to the area of the insulating base layer, the percentage of the area of the dummy conductive pattern (the area ratio of the dummy conductive pattern) to the area of the dummy formation region, and the difference between the area ratio of the conductive pattern and the area ratio of the dummy conductive pattern were measured. The results are shown in Table 1.

2. Evaluation

Of the wiring circuit board assembly sheet of each of Examples and Comparative Examples, the thickness of the conductive pattern was measured using a laser microscope (LEXT OLS5000 manufactured by Olympus Corporation) and evaluated based on the following criteria. The results are shown in Table 1.

<Evaluation Criteria>

Good: the difference between the measured value and the designed value is 5% or less with respect to the designed value.

Fair: the difference between the measured value and the designed value is more than 5% and 10% or less with respect to the designed value.

Bad: the difference between the measured value and the designed value is more than 10% with respect to the designed value.

TABLE 1

| | Area Ratio of Conductive Pattern (%) | Area Ratio of Dummy Conductive Pattern (%) | Difference (%) | Evaluation |
|---|---|---|---|---|
| Example 1 | 10.5 | 8.1 | 2.1 | Good |
| Example 2 | 10.5 | 32.7 | 22.2 | Good |
| Example 4 | 10.5 | 51.1 | 40.6 | Fair |
| Example 5 | 33.8 | 33.2 | 0.7 | Good |
| Example 6 | 33.8 | 6.9 | 25.9 | Good |
| Comp. Example 1 | 10.5 | 69.1 | 58.6 | Bad |

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The wiring circuit board assembly sheet of the present invention is used for producing wiring circuit boards.

DESCRIPTION OF REFERENCE NUMERALS

1 wiring circuit board assembly sheet
2 wiring circuit board
3 frame
22 insulating base layer
23 conductive pattern
30A dummy formation region
33A dummy conductive pattern
41 first conductive pattern
42 second conductive pattern
51A first dummy conductive pattern
52A second dummy conductive pattern
E1 edge
E2 edge
W1 width
L1 length

The invention claimed is:

1. A wiring circuit board assembly sheet comprising:

a wiring circuit board including an insulating layer and a conductive pattern located on the insulating layer;

a frame supporting the wiring circuit board and including a dummy conductive pattern made of a material identical to a material of which the conductive pattern is made; and a notch extending along an outer shape of the wiring circuit board, and defining the wiring circuit board and the frame, wherein the wiring circuit board includes a first edge located away from the dummy conductive pattern and a second edge located between the first edge and the dummy conductive pattern, wherein the frame includes a dummy formation region including the dummy conductive pattern, having a width of 5 mm from the second edge in a direction orthogonal to the second edge, having a length identical to a length of the wiring circuit board in a direction in which the second edge extends, and overlapping the notch, and wherein a difference between a percentage of an area of the conductive pattern to an area of the insulating layer and a percentage of an area of the dummy conductive pattern to an area of the dummy formation region is 50% or less.

2. The wiring circuit board assembly sheet according to claim 1, wherein the difference between the percentage of the area of the conductive pattern to the area of the insulating layer and the percentage of the area of the dummy conductive pattern to the area of the dummy formation region is 30% or less.

3. The wiring circuit board assembly sheet according to claim 1, wherein the conductive pattern includes a first conductive pattern with a first thickness and a second conductive pattern with a second thickness larger than the first thickness, and wherein the dummy conductive pattern includes a first dummy conductive pattern with the first thickness and a second dummy conductive pattern with the second thickness.

4. The wiring circuit board assembly sheet according to claim 3, wherein a difference between a percentage of an area of the first conductive pattern to the area of the insulating layer and a percentage of an area of the first dummy conductive pattern to the area of the dummy formation region is 50% or less, and wherein a difference between a percentage of an area of the second conductive pattern to the area of the insulating layer and a percentage of an area of the second dummy conductive pattern to the area of the dummy formation region is 50% or less.

5. The wiring circuit board assembly sheet according to claim 3, wherein a difference between a percentage of an area of the first conductive pattern to the area of the insulating layer and a percentage of an area of the first dummy conductive pattern to the area of the dummy formation region is 30% or less, and wherein a difference between a percentage of an area of the second conductive pattern to the area of the insulating layer and a percentage of an area of the second dummy conductive pattern to the area of the dummy formation region is 30% or less.

* * * * *